US006933188B1

(12) United States Patent
Verma et al.

(10) Patent No.: US 6,933,188 B1
(45) Date of Patent: Aug. 23, 2005

(54) USE OF A SELECTIVE HARD MASK FOR THE INTEGRATION OF DOUBLE DIFFUSED DRAIN MOS DEVICES IN DEEP SUB-MICRON FABRICATION TECHNOLOGIES

(75) Inventors: Purakh Raj Verma, Singapore (SG); Sanford Chu, Singapore (SG); Hwee Ngoh Chua, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/858,024

(22) Filed: Jun. 1, 2004

(51) Int. Cl.$^7$ .................. H01L 21/336; H01L 21/8234
(52) U.S. Cl. ............... 438/197; 438/199; 438/200; 438/232; 438/276; 438/530; 438/549
(58) Field of Search ................ 438/197, 199, 438/200, 232, 275, 276, 514, 530, 542, 549, 438/FOR 212

(56) References Cited

U.S. PATENT DOCUMENTS

| | | | | |
|---|---|---|---|---|
| 5,516,717 A | * | 5/1996 | Hsu | 438/275 |
| 5,959,418 A | * | 9/1999 | Gotou | 318/254 |
| 6,063,706 A | * | 5/2000 | Wu | 438/682 |
| 6,069,031 A | * | 5/2000 | Wu | 438/197 |
| 6,124,159 A | * | 9/2000 | Chu | 438/225 |
| 6,133,096 A | | 10/2000 | Su et al. | 438/264 |
| 6,297,108 B1 | | 10/2001 | Chu | 438/297 |
| 6,333,234 B1 | | 12/2001 | Liu | 438/307 |
| 6,570,214 B1 | | 5/2003 | Wu | 257/315 |
| 6,579,781 B1 | * | 6/2003 | Hamilton et al. | 438/514 |
| 6,642,076 B1 | * | 11/2003 | Yaung et al. | 438/48 |
| 6,713,821 B2 | * | 3/2004 | Fan et al. | 257/390 |

* cited by examiner

*Primary Examiner*—George Fourson
*Assistant Examiner*—Michelle Estrada
(74) *Attorney, Agent, or Firm*—George O. Saile; Rosemary L. S. Pike; Stephen B. Ackerman

(57) ABSTRACT

A process for integrating the fabrication of double diffused drain (DDD) MOSFET devices with the fabrication sub-micron CMOS devices, has been developed. The process features formation of an insulator hard mask shape on an underlying polysilicon gate structure shape in the DDD MOSFET region, while only a polysilicon gate structure shape is formed in the CMOS device region. High energy ion implantation procedures are employed to form the deep source/drain regions of the DDD MOSFET devices with the insulator hard mask shape preventing the high energy implantation procedure from disturbing the underlying channel region. An anneal procedure used activate and drive—in the implanted ions in the deep source/drain region of the DDD MOSFET device is followed by formation of the shallower source/drain regions of the sub-micron CMOS devices.

28 Claims, 8 Drawing Sheets

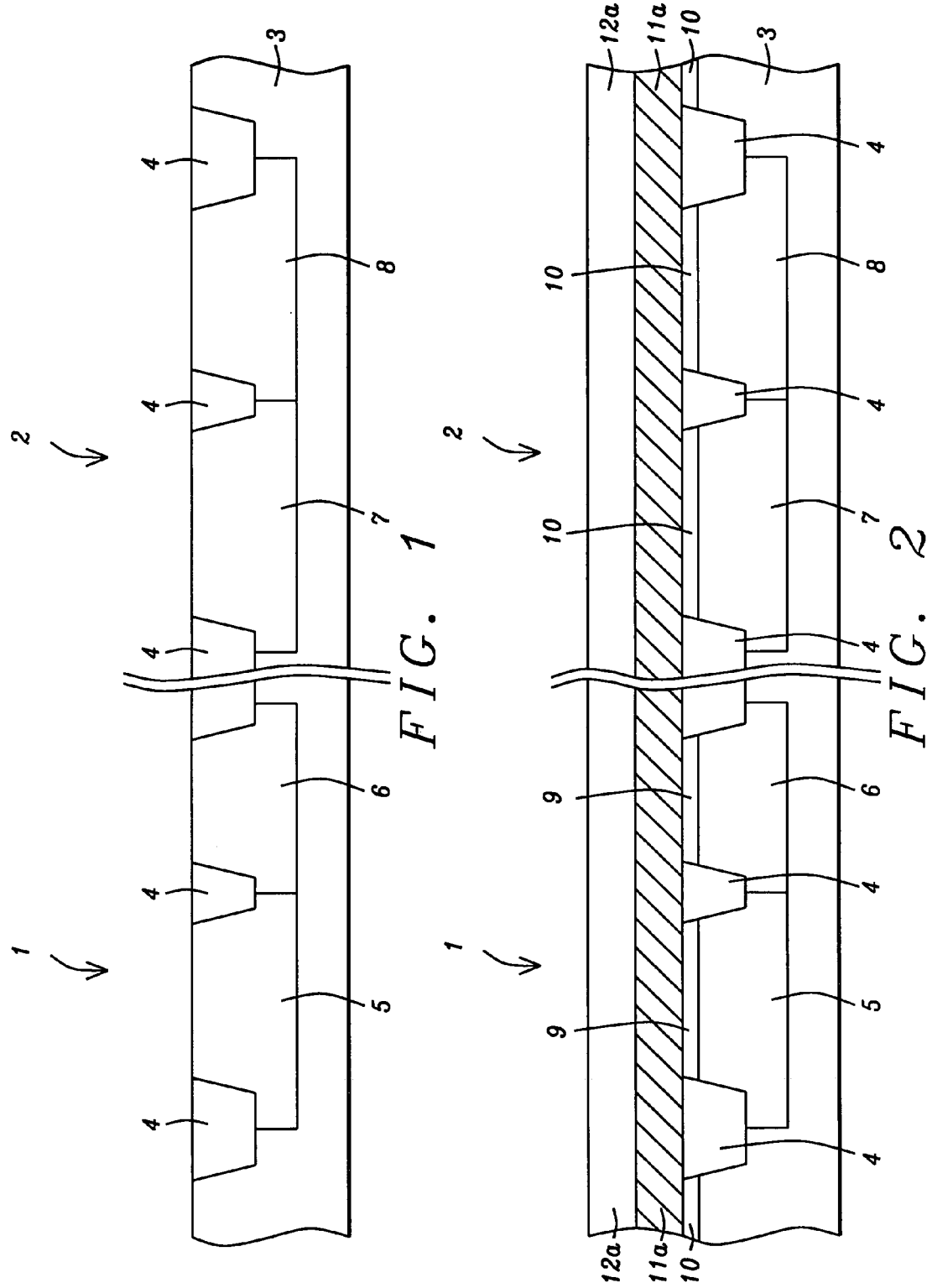

USE OF A SELECTIVE HARD MASK FOR THE INTEGRATION OF DOUBLE DIFFUSED DRAIN MOS DEVICES IN DEEP SUB-MICRON FABRICATION TECHNOLOGIES

BACKGROUND OF THE INVENTION (1) Field of the Invention

The present invention relates to methods used to fabricate semiconductor devices, and more specifically to a method used to integrate the fabrication of a high voltage double diffused drain (DDD) metal oxide semiconductor field effect transistor (MOSFET) with the fabrication of low voltage deep sub-micron complimentary metal oxide semiconductor (CMOS) devices.

(2) Description of Prior Art

High voltage transistors used for applications between abut 12 to 25 volts, have been fabricated featuring double diffused drains (DDD). To obtain the doubled diffused drain element high ion implantation energies are required. However if the fabrication of high voltage devices are to be integrated with the fabrication of low voltage devices special care must be taken to protect the low voltage devices from procedures required for the DDD components, procedures such as high energy ion implantation steps. In addition to requiring a high energy ion implantation procedure the high voltage devices also require more robust thermal cycles than the low voltage counterparts to achieve the desired DDD depth. The high voltage DDD devices also require a specific thickness of conductive gate structure needed to block the high energy ion implantation step, however if thicker conductive gate structures were also used for narrower gate low voltage devices patterning difficulties can arise as a result of unacceptable high aspect ratios. Therefore a unique process sequence is needed to integrate the fabrication of high voltage devices featuring a double diffused drain, with the fabrication of low voltage device.

The present invention will describe a novel process sequence in which the integration of high voltage and low voltage devices are successfully integrated featuring a process which allows only the device double diffused drain high voltage devices to experience the high energy ion implanted drain procedure, a specific robust thermal cycle, and to be comprised with a thickness of a composite conductive gate structure needed to protect the channel region from the high energy ion implantation procedure. Prior art such as Wu in U.S. Pat. No. 6,570,214 B1, Liu in U.S. Pat. No. 6,333,234 B1, Chu in U.S. Pat. No. 6,297,108 B1, and Su et al in U.S. Pat. No. 6,133,096,describe procedures for fabricating, and integrating DDD devices, however none of the above prior art describe the novel process sequence described in the present invention for integration of high voltage and low voltage devices.

SUMMARY OF THE INVENTION

It is an object of this invention to fabricate a double diffused drain (DDD) metal oxide semiconductor filed effect transistor (MOSFET).

It is another object of this invention to employ a fabrication sequence allowing the integration of the DDD MOSFET with the fabrication of sub-micron CMOS devices.

It is still another object of this invention to initially form the deep drain region of the DDD MOSFET prior to the fabrication of the sub-micron CMOS devices, featuring hard mask blocking procedures used to reduce the risk of implantation into the DDD MOSFET channel region.

In accordance with the present invention a method of integrating the fabrication of DDD MOSFETs with the fabrication of CMOS devices formed with sub-micron features, is described. After formation of a first gate insulator in an area of a semiconductor substrate to be used for the sub-micron CMOS devices, and after formation of a thicker second gate insulator layer to be used for the DDD MOSFETs, a polysilicon layer and an overlying insulator layer are deposited. Photolithographic and dry etching procedures are employed to define insulator shapes on a portion of the underlying polysilicon layer located in the DDD MOSFET region, while removing insulator from the underlying polysilicon layer in the CMOS region. After definition of photoresist shapes on the portion of polysilicon layer located in the CMOS region a dry etch procedure is used to define polysilicon gate structures in the CMOS region using the photoresist shapes as an etch mask, while the same dry etch procedure is used to define polysilicon gate structures in the DDD MOSFET region using the overlying insulator shapes for definition. Photoresist block out masking of the CMOS region next allows high energy implantation procedures to place ions only in areas of the DDD MOSFET region not covered by the insulator hard mask shape—polysilicon gate structure. A first anneal procedure then results in activation of the implanted ions and in the desired depth of deep DDD MOSFET source/drain regions. Photoresist block out masking of the DDD MOSFET region then allows a lower energy ion implantation procedure to place desired ions in areas of the CMOS region needed for the shallower source/drain region. A second anneal procedure is next used to activate the implanted ions in the shallower source/drain region of the sub-micron CMOS devices.

BRIEF DESCRIPTION OF THE DRAWINGS

The object and other advantages of this invention are described in the preferred embodiments with reference to the attached drawings that include:

FIGS. 1–9, which schematically in cross-sectional style describe key stages of a fabrication sequence used to integrate the formation of DDD MOSFETs with the formation of CMOS devices defined with sub-micron features.

DESCRIPTION OF THE PREFERRED EMBODIMENTS

Figure 3:
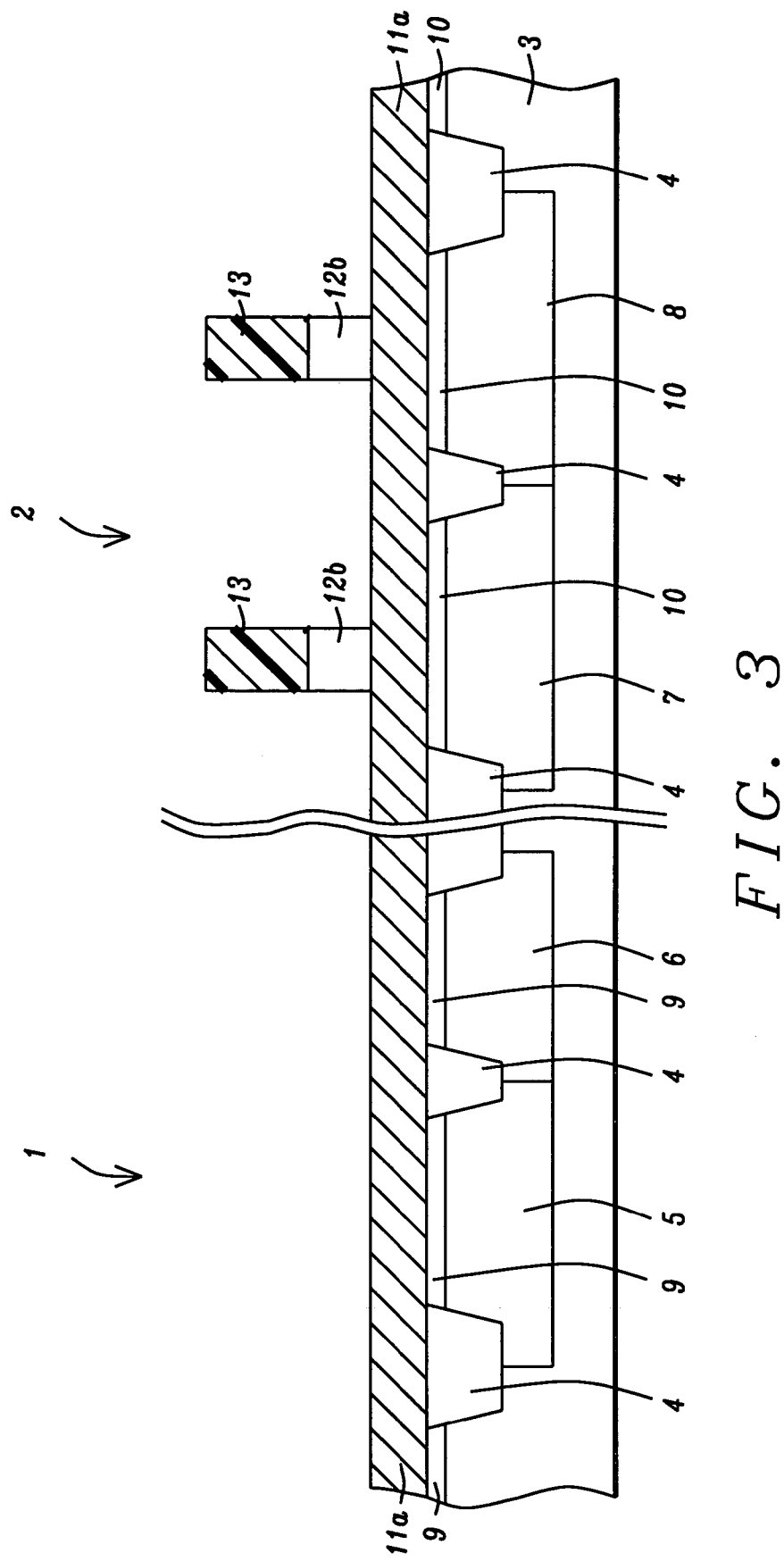

The method used to integrate the fabrication of DDD MOSFET devices with the fabrication of sub-micron CMOS devices will now be described in detail. Semiconductor substrate 3, comprised of P type single crystalline silicon, featuring a <100> crystallographic orientation, is used and schematically shown in FIG. 1. Region 1, of semiconductor substrate3, will be used to accommodate the sub-micron CMOS devices, while region 2, will be the area used for fabrication of the DDD MOSFET devices. Insulator filled shallow trench isolation (STI) regions 4, are formed in specific areas of semiconductor substrate 3, via dry etch definition forming shallow trench shapes, chemical vapor deposition insulator layer filling of the shallow trench shapes, and insulator layer planarization or removal of unwanted insulator layer from the top surface of semiconductor substrate 3. To subsequently accommodate either N channel or P channel MOSFET devices, N well and P well regions are formed in specific areas of semiconductor substrate 3. P well region 5, in CMOS region 1, is formed to accommodate a subsequent sub-micron N channel MOSFET device, while P well region 7, is formed in DDD MOSFET region 2, for accommodation of a subsequent N channel DDD MOSFET device. In addition N well region 6, in CMOS region 1, is formed to accommodate a subsequently formed sub-micron P channel MOSFET device, while N well region 8, is formed in DDD MOSFET region 2, for accommodation of a subsequent P channel DDD MOSFET device. The well regions are obtained via photoresist block out masking and ion implantation procedures.

CMOS device gate insulator layer 9, and thicker DDD MOSFET gate insulator layer 10, are next formed and schematically shown in FIG. 2. This is accomplished by thermally growing a silicon dioxide layer on entire the top surface of semiconductor substrate 3, then removing silicon dioxide only from the portion of top surface of semiconductor substrate 3, located in CMOS region 1. A subsequent thermal oxidation procedure performed in an oxygen steam ambient results in the growth of silicon dioxide gate insulator layer 9, at a thickness between about 20 to 120 Angstroms in CMOS device region 1, and the emergence of thicker silicon dioxide gate insulator layer 10, between about 250 to 800 Angstroms, in DDD MOSFET region 2. Conductive layer 11a, a layer such as doped polysilicon, is next obtained via low pressure chemical vapor deposition (LPCVD) procedures, at a thickness between about 1500 to 3000 Angstroms. The polysilicon layer can either be doped in situ during deposition via the addition of phosphine or arsine to a silane or disilane ambient, or the polysilicon layer can be deposited intrinsically then doped via implantation of arsenic or phosphorous ions. Insulator layer 12a, a layer such as silicon oxide, is next deposited to a thickness between about 1000 to 5000 Angstroms via LPCVD or via plasma enhanced chemical vapor deposition (PECVD) procedures, using tetraethylorthosilicate (TEOS) as a source. If desired insulator layer 12a, can be comprised of silicon nitride or silicon oxynitride. The result of the above procedures is schematically shown in FIG. 2.

Formation of insulator or silicon oxide hard mask shapes 12b, in DDD MOSFET region 2, is next addressed and schematically described in FIG. 3. Since narrow width gate structures are needed for the desired high performance of CMOS devices, narrow, thin gate structures are required to minimize aspect ratios for the dry etch definition of the gate structures. However if process integration is desired thin gate structures needed for CMOS devices will have difficulty blocking the high energy ion implantation procedure employed for the deep drain of the DDD MOSFET devices, therefore silicon oxide hard mask shapes 12b, are formed on underlying polysilicon layer 11a, in DDD MOSFET region 2, to be used as additional blocking material during the subsequent high energy ion implantation procedure. This is accomplished via formation of photoresist shapes 13, on underlying insulator layer 12a, followed by an anisotropic reactive ion etch (RIE) procedure performed using $CHF_3$ as a selective etchant for silicon oxide, with the RIE procedure terminating at the appearance of polysilicon layer 11a. The above dry etch procedure results in the definition of silicon oxide hard mask shapes 12b, on underlying polysilicon layer 11a, in DDD MOSFET region 2, while complete removal of silicon oxide from the top surface of polysilicon layer 11a, was accomplished in CMOS device region 1. Photoresist shapes 13, are now removed via plasma oxygen ashing procedures.

Figure 4:
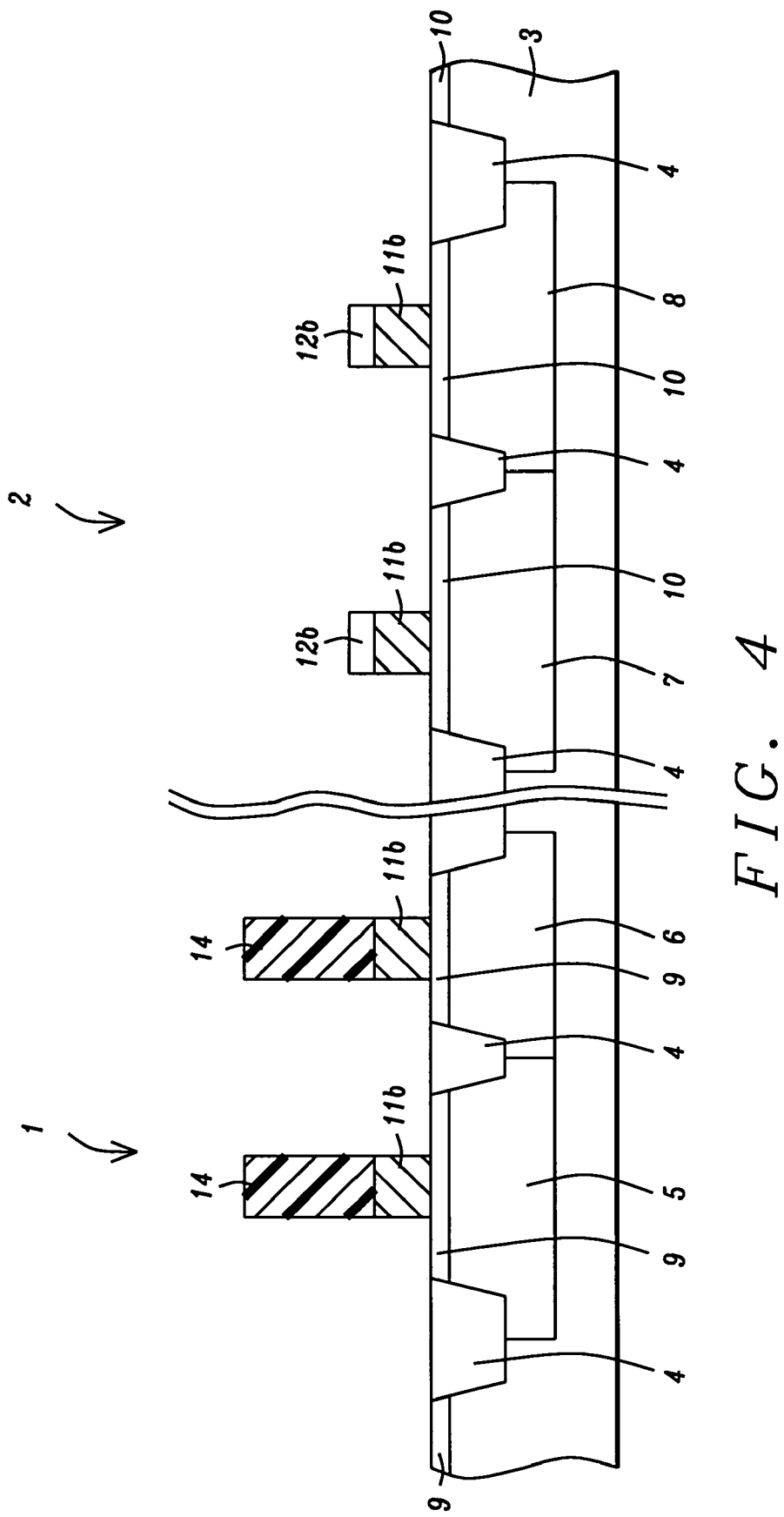

Photoresist shapes 14, are next defined on the portion of polysilicon layer 11a, located only in CMOS device region 1. Using photoresist shapes 14, as an etch mask for polysilicon layer 11a, in CMOS device region 1, while using silicon oxide hard mask shapes 12b, as an etch mask for polysilicon layer 11a, in DDD MOSFET region 2, another anisotropic RIE procedure featuring $Cl_2$ as a selective etchant is employed to define polysilicon gate structures 11b. The selective RIE procedure terminated at the appearance of the underlying silicon dioxide gate insulator layers, however of greater importance is the selectivity of the gate structure definition procedure allowed silicon dioxide hard mask shapes 12b, to remain with a thickness needed for masking of the subsequent high energy ion implantation procedure employed for the deep drain of the DDD MOSFET device. The result of this procedure is schematically shown in FIG. 4. Photoresist shapes 14, are now removed again using plasma oxygen ashing procedures followed by final wet clean procedures. The above wet clean procedure is performed featuring a buffered hydrofluoric acid component used to remove any native oxide that may have formed during plasma oxygen procedures, with the buffered hydrofluoric component removing portions of silicon dioxide gate insulator layer 9, and portions of silicon dioxide gate insulator layer 10, not covered by the polysilicon gate structures.

Figure 5:
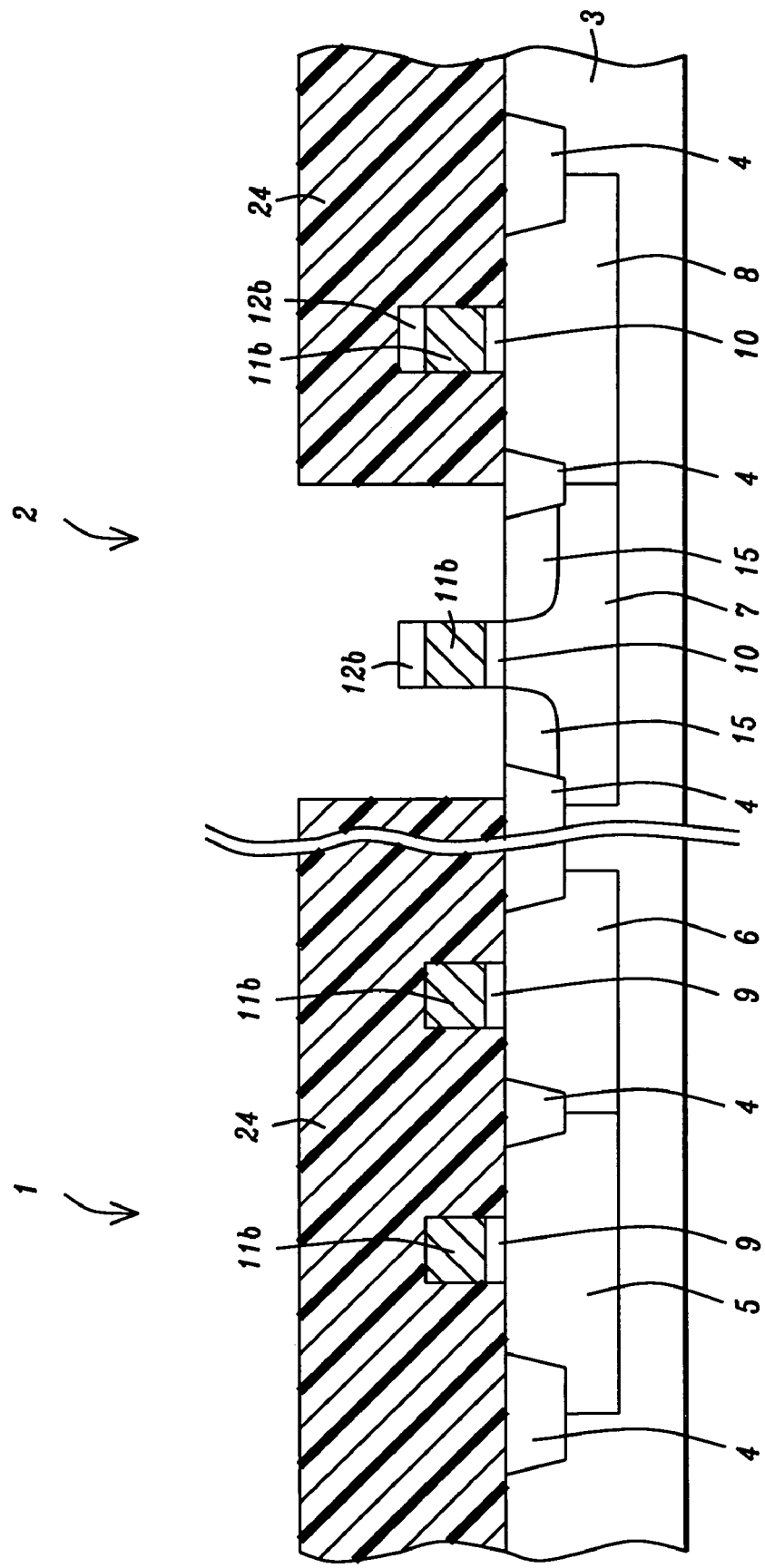
Figure 6:
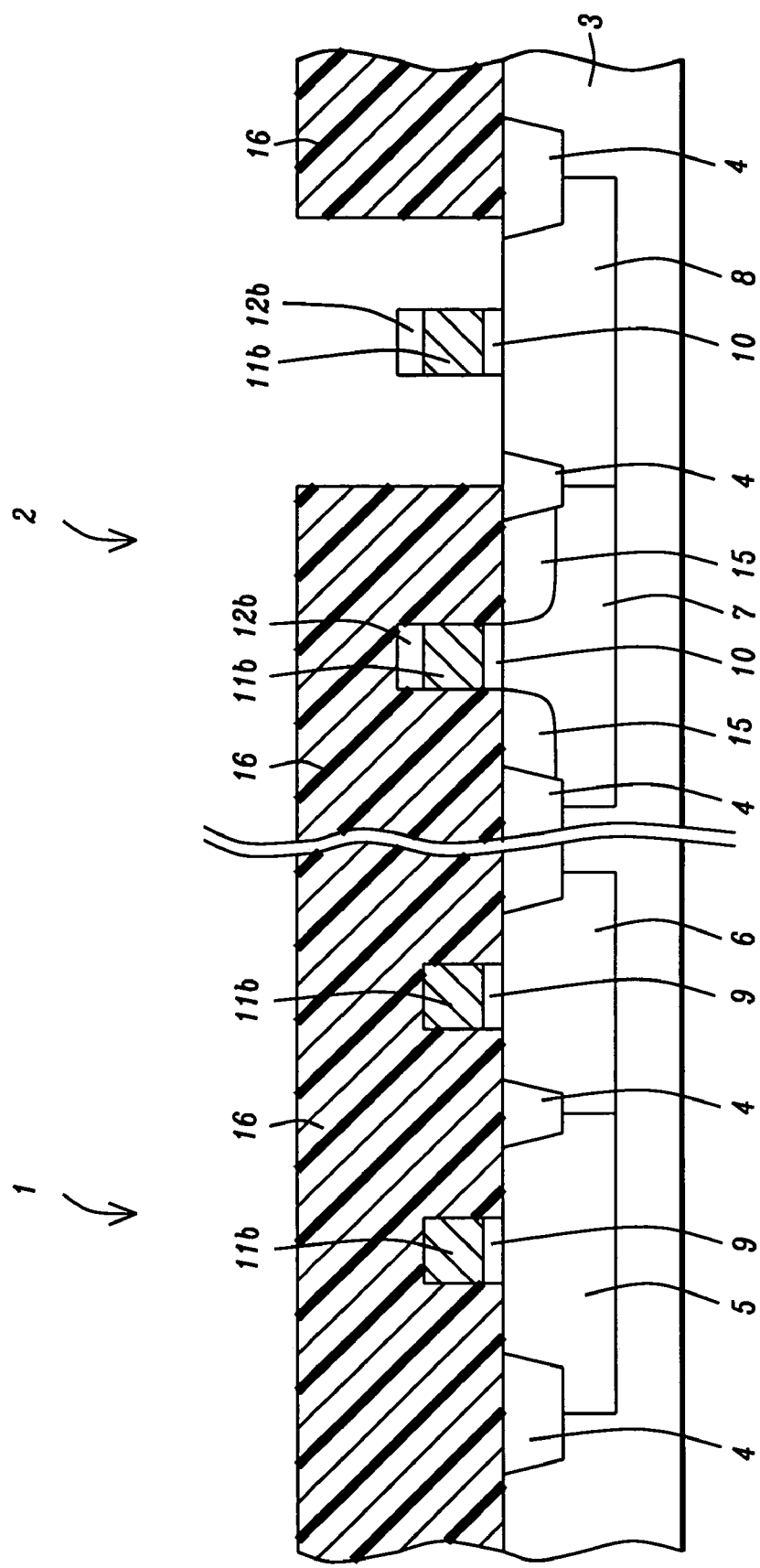

Procedures used to form the deep diffused drain region for the high voltage devices, devices designed to operate at voltages between about 12 to 25 volts, are next addressed and schematically described in FIGS. 5–6. Photoresist shape 24, is formed to block out deep sub-micron region 1, from a high energy ion implantation procedure used to form an N channel channel high voltage device in DDD MOSFET region 2, with photoresist shape 24, also used as a block out shape for the portion of DDD MOSFET region 2, to be used to accommodate a subsequent P channel high voltage device. With photoresist shape 24, in place phosphorous ions are implanted into portions of P well region 7, not covered by the composite structure comprised of silicon oxide hard mask shape 12b, and underlying polysilicon gate structure 11b. The implantation procedure is performed at an energy between about 130 to 300 KeV, at a dose between about 5E12 to 8E13 atoms/cm$^2$, using an implantation angle between about 7 to 45 degrees. Silicon dioxide hard mask shape 12b, in combination with underlying polysilicon gate structure 11b, prevented arsenic implantation in an underlying portion of semiconductor substrate 3, the portion designed to be the device channel region. A thicker polysilicon gate structure also would have prevented implantation into the channel region, however thicker polysilicon gate structures would be unacceptable for deep sub-micron CMOS devices, and thus the use of two different polysilicon thicknesses would offer a more complex and costly integration sequence. The result of the above implantation procedure is the creation of N type DDD source/drain region 15, shown schematically in FIG. 5.

After removal of photoresist shape 24, via plasma oxygen ashing procedures, photoresist shape 16, is defined and used as a block out shape to protect deep sub-micron CMOS region 1, and the N type high voltage device in DDD MOSFET region 2, from a high energy boron ion implantation procedure used to form the P channel high voltage device in DDD MOSFET region 2. Implantation is performed using boron at an energy between about 50 to 180 KeV, at a dose between about 5E12 to 8E13 atoms/cm$^2$, using an implantation angle between about 7 to 45 degrees. Again silicon dioxide hard mask shape 12b, in combination with underlying polysilicon gate structure 11b, prevented boron ions from being placed in a portion of semiconductor designed to be a subsequent channel region. The result of this implantation procedure is the creation of P type DDD source/drain region 17, in portions of N well region 8, not covered by silicon oxide hard mask shape 12b—polysilicon gate structure 11b. This is schematically shown in FIG. 6.

After removal of photoresist shape 16, via plasma oxygen ashing procedures an anneal procedure is employed to activate the implanted ions in the DDD MOSFET source/drain regions, as well as to drive in, or deepen N type source/drain region 15, and P type source/drain region 17. The anneal cycle performed in a nitrogen or argon ambient at a temperature between about 700 to 1000° C., for a time between about 10 to 60 min, using a conventional furnace or a rapid thermal anneal tool, is performed prior to formation of the shallower source/drain regions needed for the CMOS devices in CMOS device region 1.

Figure 7:
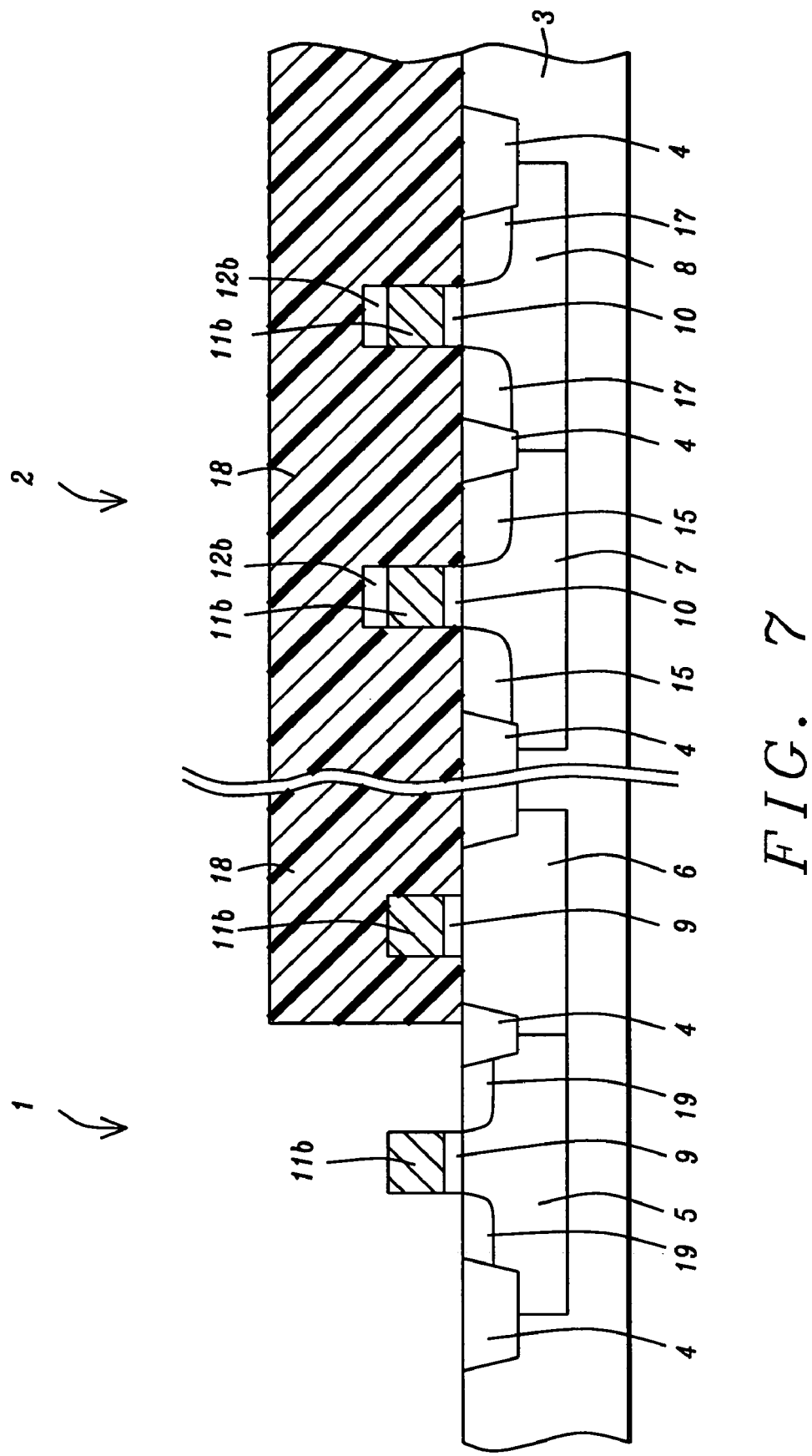
Figure 8:
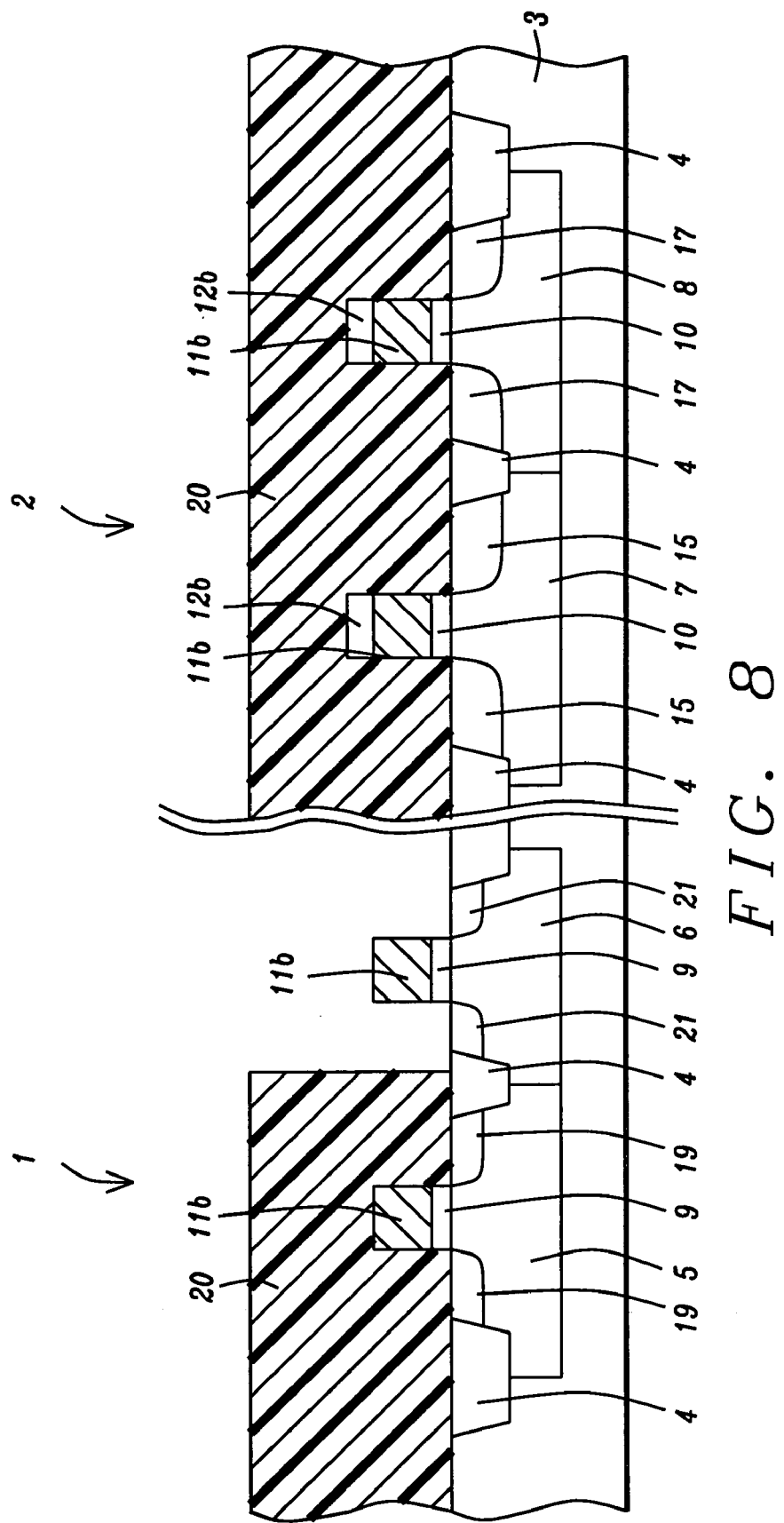

Formation of the shallower source/drain regions needed for the CMOS devices is next addressed and schematically illustrated in FIGS. 7–8. Photoresist block out masking is again employed to allow implantation to be performed only in a desired portion of CMOS region 1, while other portions of CMOS region 1, and the entire DDD MOSFET region 2, are protected by the photoresist block out shape. Photoresist shape 18, is defined to protect DDD MOSFET region 2, and a subsequent P channel CMOS device, from implantation of arsenic or phosphorous ions used to create shallow N type source/drain region 19, (the LDD region for the low voltage NMOS device), in exposed portions of P well region 5. This is schematically shown in FIG. 7. Implantation was performed at an energy between about 20 to 80 KeV, as a dose between about 1E13 to 1E15 atoms/cm$^2$, using an implantation angle between about 0 to 7 degrees.

After removal of photoresist shape 18, via plasma oxygen ashing procedures, photoresist shape 20, is defined to cover DDD MOSFET region 2, and the N channel CMOS device. Implantation of boron ions is next accomplished at an energy between about 4 to 12 KeV, at a dose between about 1E13 to 2E15 atoms/cm$^2$ using an implantation angle between about 0 to 7 degrees, creating shallow P type LLD region 21, for the low voltage PMOS device, in exposed portions of N well region 6. This is schematically shown in FIG. 8. The shallower source/drain regions are required for the lower voltage devices in CMOS device region 1, devices operating at voltages between about 1.2 to 5 volts. After removal of photoresist shape 20, via plasma oxygen ashing procedures an anneal is performed at a temperature between about 900 to 1050° C., in an argon or nitrogen ambient, for a time between about 10 to 45 sec, using a conventional or rapid thermal anneal tool, to activate the implanted ions in the shallow source/drain regions located in CMOS region 1. The deeper source/drain regions in DDD MOSFET region 2, also experience the second anneal cycle resulting in deeper source/drain regions.

Figure 9:
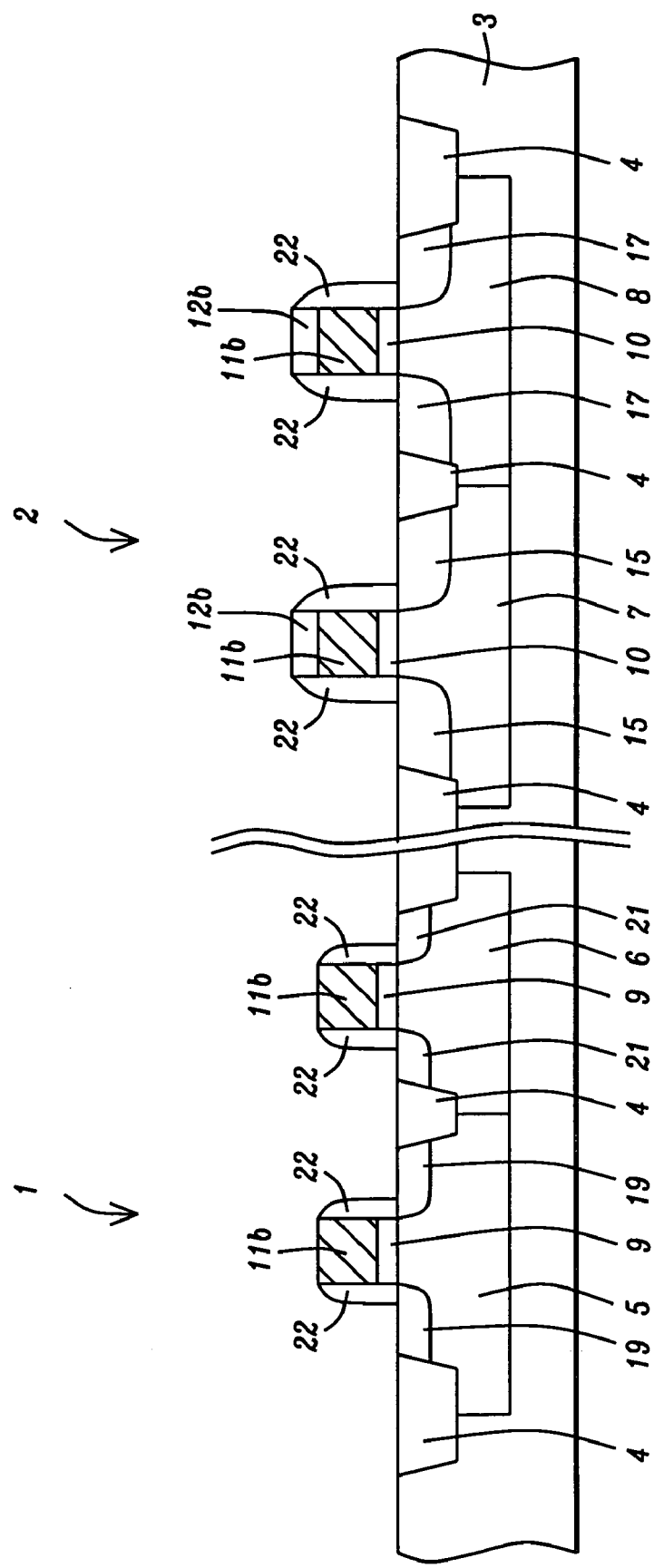

Insulator spacers 22, are next formed on the sides of polysilicon gate structures 11b, in CMOS device region 1, and on the sides of silicon dioxide hard mask shape 12b—polysilicon gate structure 11b, in DDD MOSFET region 2. This is accomplished via LPCVD or PECVD procedures depositing silicon oxide or silicon nitride at a thickness between about 500 to 1200 Angstroms, followed by a anisotropic RIE procedure performed using CHF$_3$ or CF$_4$ as an etchant. This is schematically shown in FIG. 9. Photoresist masking and ion implantation procedures similar to procedures previously employed for the LDD regions, are again employed to form heavily doped source/drain regions in areas of well regions not covered by the conductive gate structures or by the insulator spacers. If desired to further increase performance of the low voltage devices in CMOS device region 2, metal silicide can be formed on the poly-silicon gate structure as well as on the shallow source/drain region. The high voltage devices in DDD MOSFET region 3, do not need the benefit of metal silicide and can be protected during the metal silicide formation procedure applied to the low voltage devices in CMOS device region 3.

While this invention has been particularly shown and described with reference to the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET) device on a semiconductor substrate, comprising the steps of:

providing a gate insulator layer on said semiconductor substrate;

forming a composite structure comprised of an underlying polysilicon gate structure at a thickness between about 1500 to 3000 Angstroms, and comprised of an overlying insulator hard mask shape at a thickness between about 1000 to 5000 Angstroms, wherein said composite structure is defined via an anisotropic reactive ion etch procedure using CHF$_3$ as an etchant to define said insulator hard mask shape and using Cl$_2$ as an etchant to define said polysilicon gate structure;

performing an ion implantation procedure using an implant angle between about 7 to 45 degrees to place ions in top portions of said semiconductor substrate not covered by said composite structure, forming a source/drain region; and performing an anneal procedure at a temperature between about 700 to 1000° C., for a time between about 10 to 60 min, in a nitrogen or argon ambient to activate said ions in said source/drain region and to increase depth of said source/drain region in said semiconductor substrate.

2. The method of claim 1, wherein said MOSFET device is an N channel, double diffused drain (DDD) device.

3. The method of claim 1, wherein said MOSFET device is a P channel, double diffused drain (DDD) device.

4. The method of claim 1, wherein said gate insulator layer is a silicon dioxide layer obtained via thermal oxidation procedures at a thickness between about 20 to 800 Angstroms.

5. The method of claim 1, wherein said polysilicon gate structure is defined from a polysilicon layer, wherein the polysilicon layer is obtained via low pressure chemical vapor deposition (LPCVD) procedures at a thickness between about 1500 to 3000 Angstroms.

6. The method of claim 1, wherein said insulator hard mask shape is a silicon oxide hard mask shape defined from a silicon oxide layer, wherein the silicon oxide is obtained via LPCVD or via plasma enhanced chemical vapor deposition (PECVD) procedures at a thickness between about 1000 to 5000 Angstroms.

7. The method of claim 1, wherein said insulator hard mask shape is a silicon oxide hard mask shape defined from a silicon oxide layer obtained via LPCVD or via plasma enhanced chemical vapor deposition (PECVD) procedures, using tetraethylorthosilicate (TEOS) as a source.

8. The method of claim 1, wherein said insulator hard mask shape is a silicon nitride hard mask shape defined from a silicon nitride layer obtained via LPCVD or via plasma enhanced chemical vapor deposition (PECVD) procedures, at a thickness between about 500 to 4000 Angstroms.

9. The method of claim 1, wherein said insulator hard mask shape is a silicon oxynitride hard mask shape defined from a silicon oxynitride layer obtained via LPCVD or via plasma enhanced chemical vapor deposition (PECVD) procedures, at a thickness between about 500 to 4000 Angstroms.

10. The method of claim 1, wherein said ion implantation procedure is performed using phosphorous ions at an energy between about 130 to 300 KeV, at an implant dose between about 5E12 to 8E13 atoms/cm$^2$.

11. The method of claim 1, wherein said ion implantation procedure is performed using boron ions at an energy between about 50 to 180 KeV, at an implant dose between about 5E12 to 8E13 atoms/cm$^2$.

12. A method of integrating the formation of a double diffused drain (DDD) MOSFET device with the formation of complimentary metal oxide semiconductor (CMOS) devices comprised with sub-micron features, comprising the steps of:

forming a first gate insulator layer on a first portion of a semiconductor substrate to be used as a CMOS device region, and forming a second gate insulator layer on a second portion of said semiconductor substrate to be used as a DDD MOSFET region;

forming a polysilicon layer;

forming an insulator layer;

performing a patterning procedure to form an insulator hard mask shape on a portion of said polysilicon layer located in said DDD MOSFET region;

forming a photoresist shape on a portion of said polysilicon located in said CMOS device region;

performing an anisotropic reactive ion etching procedure to form a first polysilicon gate structure on said first gate insulator layer in said CMOS device region, and to form a second polysilicon gate structure, underlying said insulator hard mask shape, on said second gate insulator layer in said DDD MOSFET region;

performing first ion implantation procedures in said DDD MOSFET region to form deep source/drain regions in areas of said second portion of said semiconductor substrate not covered by composite structure comprised of said insulator hard mask shape on said second polysilicon gate structure;

performing a first anneal procedure to activate ions in said deep source/drain region and to increase depth of said deep source/drain regions in said semiconductor substrate;

performing second implantation procedures in said CMOS device region to form shallow source/drain regions in areas of said first portion of said semiconductor substrate not covered by said first polysilicon gate structure; and performing a second anneal procedure to activate ions in said shallow source/drain region.

13. The method of claim 12, wherein said DDD MOSFET device is an N channel MOSFET device.

14. The method of claim 12, wherein said DDD MOSFET device is a P channel MOSFET device.

15. The method of claim 12, wherein said CMOS devices are comprised of N channel or P channel devices.

16. The method of claim 12, wherein said first gate insulator layer is a silicon dioxide layer, obtained via thermal oxidation procedures at a thickness between about 20 to 120 Angstroms.

17. The method of claim 12, wherein said second gate insulator layer is a silicon dioxide layer, obtained via thermal oxidation procedures at a thickness between about 250 to 800 Angstroms.

18. The method of claim 12, wherein said polysilicon layer is a doped polysilicon layer obtained via LPCVD procedures at a thickness between about 1500 to 3000 Angstroms, doped in situ during deposition via the addition of arsine or phosphine to a silane or to a disilane ambient.

19. The method of claim 12, wherein said insulator layer is a silicon oxide layer obtained via LPCVD or via plasma enhanced chemical vapor deposition (PECVD) procedures, at a thickness between about 1000 to 5000 Angstroms, using tetraethylorthosilicate (TEOS) as a source.

20. The method of claim 12, wherein said insulator layer is a silicon nitride or silicon oxynitride layer obtained via LPCVD or PECVD procedures, at a thickness between about 500 to 4000 Angstroms.

21. The method of claim 12, wherein said insulator hard mask shape is defined via an anisotropic reactive ion etch procedure using $CHF_3$ or $CF_4$ as an etchant.

22. The method of claim 12, wherein said anisotropic reactive ion etch procedure used to define said first polysilicon gate structure in said CMOS device region and to define said second polysilicon gate structure in said DDD MOSFET region, is performed using $Cl_2$ as an etchant.

23. The method of claim 12, wherein said first ion implantation procedures used to form said deep source/drain regions in said DDD MOSFET region are performed using phosphorous ions at an energy between about 130 to 300 KeV, at an implant dose between about 5E12 to 8E13 atoms/cm$^2$, and using an implant angle between about 7 to 45 degrees.

24. The method of claim 12, wherein said first ion implantation procedures used to form said deep source/drain region in said DDD MOSFET regions are performed using boron ions at an energy between about 50 to 180 KeV, at an implant dose between about 5E12 to 8E13 atoms/cm$^2$, and using an implant angle between about 7 to 45 degrees.

25. The method of claim 12, wherein said first anneal procedure is performed at a temperature between about 700 to 1000° C., for a time between about 10 to 60 min, in a nitrogen or argon ambient.

26. The method of claim 12, wherein said second ion implantation procedure used to form shallow source/drain regions in said CMOS device region are performed using arsenic or phosphorous ions at an energy between about 20 to 80 KeV, at an implant dose between about 1E13 to 2E15 atoms/cm$^2$, and using an implant angle between about 0 to 7 degrees.

27. The method of claim 12, wherein said second ion implantation procedure used to form shallow source/drain regions in said CMOS device region are performed using boron ions at an energy between about 4 to 12 KeV, at an implant dose between about 1E13 to 2E15 atoms/cm$^2$, and using an implant angle between about 0 to 7 degrees.

28. The method of claim 12, wherein said second anneal procedure is performed at a temperature between about 900 to 1050° C., for a time between about 10 to 40 sec, in a nitrogen or argon ambient.

* * * * *